United States Patent
Zhao

(10) Patent No.: US 11,119,407 B2
(45) Date of Patent: Sep. 14, 2021

(54) METHOD OF CUTTING A FLEXIBLE SUBSTRATE

(71) Applicant: WUHAN CHINA STAR OPTOELECTRONICS SEMICONDUCTOR DISPLAY TECHNOLOGY CO., LTD., Wuhan (CN)

(72) Inventor: Kaixiang Zhao, Wuhan (CN)

( * ) Notice: Subject to any disclaimer, the term of this patent is extended or adjusted under 35 U.S.C. 154(b) by 409 days.

(21) Appl. No.: 16/320,104

(22) PCT Filed: Dec. 25, 2018

(86) PCT No.: PCT/CN2018/123429
§ 371 (c)(1),
(2) Date: Jan. 24, 2019

(87) PCT Pub. No.: WO2020/113711
PCT Pub. Date: Jun. 11, 2020

(65) Prior Publication Data
US 2021/0181626 A1    Jun. 17, 2021

(30) Foreign Application Priority Data

Dec. 6, 2018 (CN) .......................... 201811483983.3

(51) Int. Cl.
*G03F 7/20* (2006.01)
*G03F 7/00* (2006.01)

(52) U.S. Cl.
CPC .................................. *G03F 7/0007* (2013.01)

(58) Field of Classification Search
CPC ......... G03F 1/80; G03F 7/0007; H01L 21/78; H01L 21/302; H01L 21/782; H01L 2924/00

USPC .................. 216/48; 355/77; 430/49.42, 310; 438/460–465, 689, 700
See application file for complete search history.

(56) References Cited

U.S. PATENT DOCUMENTS

| | | | |
|---|---|---|---|
| 2004/0142284 A1* | 7/2004 | Sakaguchi | H01L 21/78 430/311 |
| 2014/0300877 A1* | 10/2014 | Menon | G03F 7/2051 355/53 |
| 2015/0041793 A1* | 2/2015 | Chan | H01L 51/56 257/40 |
| 2015/0287638 A1* | 10/2015 | Park | H01L 21/31105 438/462 |
| 2017/0263461 A1 | 9/2017 | Matsubara et al. | |
| 2017/0263502 A1 | 9/2017 | Okita et al. | |
| 2018/0151435 A1* | 5/2018 | Chiang | H01L 21/78 |
| 2019/0157100 A1* | 5/2019 | Harikai | H01L 24/14 |

(Continued)

FOREIGN PATENT DOCUMENTS

| | | |
|---|---|---|
| CN | 103293742 A | 9/2013 |
| CN | 107180754 A | 9/2017 |
| CN | 107180788 A | 9/2017 |

*Primary Examiner* — Colin W Kreutzer

(57) ABSTRACT

A method of cutting a flexible substrate includes providing a flexible substrate pre-configured with a cutting area, providing an obstruction covering a non-cutting area of the flexible substrate to expose the cutting area of the flexible substrate, and performing a dry etching to the flexible substrate to decompose the cutting area of the flexible substrate, such that internal components of the flexible substrate can be protected during a flexible substrate cutting process.

18 Claims, 2 Drawing Sheets

(56) References Cited

U.S. PATENT DOCUMENTS

| | | | | |
|---|---|---|---|---|
| 2019/0304838 A1* | 10/2019 | Saeki | ................ | B23K 26/0006 |
| 2019/0378747 A1* | 12/2019 | Akutsu | .................... | B32B 7/02 |
| 2020/0098635 A1* | 3/2020 | Jeon | ..................... | H01L 21/308 |
| 2021/0082762 A1* | 3/2021 | Colin | ................. | B81C 1/00904 |

* cited by examiner

METHOD OF CUTTING A FLEXIBLE SUBSTRATE

FIELD OF INVENTION

The present disclosure relates to the field of display panel technologies, and more particularly to a method of cutting a flexible substrate.

BACKGROUND OF INVENTION

In actual productions, in order to adapt to multi-platform display schemes, panel substrates usually adopt flexible substrates, and the flexible substrates need to obtain a plurality of display panels by cutting. At present, the flexible substrates are usually cut by laser cutting, that is, laser is used to cut the flexible substrates between the display panels. Because the flexible substrates are generally made of polyimide, thermal conductivity is relatively good, heat generated by the laser cutting is quickly transmitted to surrounding circuit components, which may cause damage or electrical fluctuation of the circuit components.

SUMMARY OF INVENTION

An embodiment of the present disclosure provides a method of cutting a flexible substrate to solve issues that heat generated by current laser cuttings cause damage or electrical fluctuation of surrounding circuit components.

An embodiment of the present disclosure provides a method of cutting a flexible substrate. The method of cutting the flexible substrate includes providing a flexible substrate pre-configured with a cutting area, providing an obstruction covering a non-cutting area of the flexible substrate to expose the cutting area of the flexible substrate, and performing a dry etching to the flexible substrate to decompose the cutting area of the flexible substrate.

In an embodiment of the present disclosure, the obstruction is a photoresist, and providing the obstruction covering the non-cutting area of the flexible substrate to expose the cutting area of the flexible substrate includes coating a layer of the photoresist on a surface of the flexible substrate, attaching a photomask to the photoresist, and performing an exposure process to the photoresist on the flexible substrate by the photomask to retain the photoresist on the non-cutting area and dissolve the photoresist on the cutting area.

In an embodiment of the present disclosure, the photoresist is a positive photoresist and includes an opaque area corresponding to the non-cutting area of the flexible substrate and a light transmissive area corresponding to the cutting area of the flexible substrate, in the exposure process, the photoresist on the non-cutting area of the flexible substrate not exposed to light is retained, and the photoresist on the cutting area of the flexible substrate exposed to the light is dissolved.

In an embodiment of the present disclosure, the photoresist is a negative photoresist and includes an opaque area corresponding to the cutting area of the flexible substrate and a light transmissive area corresponding to the non-cutting area of the flexible substrate, in the exposure process, the photoresist on the non-cutting area of the flexible substrate exposed to light is retained, and the photoresist on the cutting area of the flexible substrate not exposed to the light is dissolved.

In an embodiment of the present disclosure, after performing the exposure process to the flexible substrate, the method further includes removing the photomask on the photoresist.

In an embodiment of the present disclosure, the obstruction is a stretched net, and providing the obstruction covering the non-cutting area of the flexible substrate using a stretched net device to expose the cutting area of the flexible substrate includes attaching the stretched net to the non-cutting area of the flexible substrate to expose the cutting area of the flexible substrate.

In an embodiment of the present disclosure, the stretched net includes a metal stretched net or a quartz stretched net.

In an embodiment of the present disclosure, the flexible substrate is made of polyimide, and performing the dry etching to the flexible substrate to decompose the cutting area of the flexible substrate includes dry etching to the flexible substrate using sulfur hexafluoride to decompose the cutting area of the flexible substrate.

In an embodiment of the present disclosure, after performing the dry etching to the flexible substrate, the method further includes dissolving the photoresist on the non-cutting area of the flexible substrate using a photoresist stripping solution.

In an embodiment of the present disclosure, after performing the dry etching to the flexible substrate, the method further includes separating the stretched net from the flexible substrate using the stretched net device.

An embodiment of the present disclosure further provides a method of cutting a flexible substrate. The method of cutting the flexible substrate includes providing a flexible substrate pre-configured with a cutting area, providing an obstruction covering a non-cutting area of the flexible substrate to expose the cutting area of the flexible substrate, performing a dry etching to the flexible substrate to decompose the cutting area of the flexible substrate, and removing the obstruction covering the flexible substrate.

In an embodiment of the present disclosure, the obstruction is a photoresist, and providing the obstruction covering the non-cutting area of the flexible substrate to expose the cutting area of the flexible substrate includes coating a layer of the photoresist on a surface of the flexible substrate, attaching a photomask to the photoresist, and performing an exposure process to the photoresist on the flexible substrate by the photomask to retain the photoresist on the non-cutting area and dissolve the photoresist on the cutting area.

In an embodiment of the present disclosure, the photoresist is a positive photoresist and includes an opaque area corresponding to the non-cutting area of the flexible substrate and a light transmissive area corresponding to the cutting area of the flexible substrate, in the exposure process, the photoresist on the non-cutting area of the flexible substrate not exposed to light is retained, and the photoresist on the cutting area of the flexible substrate exposed to the light is dissolved.

In an embodiment of the present disclosure, the photoresist is a negative photoresist and includes an opaque area corresponding to the cutting area of the flexible substrate and a light transmissive area corresponding to the non-cutting area of the flexible substrate, in the exposure process, the photoresist on the non-cutting area of the flexible substrate exposed to light is retained, and the photoresist on the cutting area of the flexible substrate not exposed to the light is dissolved.

In an embodiment of the present disclosure, after performing the exposure process to the flexible substrate, the method further includes removing the photomask on the photoresist.

In an embodiment of the present disclosure, the obstruction is a stretched net, and providing the obstruction covering the non-cutting area of the flexible substrate using a stretched net device to expose the cutting area of the flexible substrate includes attaching the stretched net to the non-cutting area of the flexible substrate to expose the cutting area of the flexible substrate.

In an embodiment of the present disclosure, the stretched net includes a metal stretched net or a quartz stretched net.

In an embodiment of the present disclosure, the flexible substrate is made of polyimide, and performing the dry etching to the flexible substrate to decompose the cutting area of the flexible substrate includes dry etching to the flexible substrate using sulfur hexafluoride to decompose the cutting area of the flexible substrate.

In an embodiment of the present disclosure, removing the obstruction covering the flexible substrate includes dissolving the photoresist on the non-cutting area of the flexible substrate using a photoresist stripping solution.

In an embodiment of the present disclosure, removing the obstruction covering the flexible substrate includes separating the stretched net from the flexible substrate using the stretched net device.

The embodiment of the present disclosure has beneficial effects that when the flexible substrate is cut, the non-cutting area of the flexible substrate is covered with the obstruction, the cutting area of the flexible substrate is exposed, and then the flexible substrate is dry etched, only the flexible substrate of the cutting area is decomposed to perform cutting of the flexible substrate, and no heat is generated during a cutting process to protect internal components of the flexible substrate.

DESCRIPTION OF DRAWINGS

The technical solutions and other advantageous effects of the present disclosure will be apparent from the detailed description of the embodiments of the present disclosure.

DETAILED DESCRIPTION OF PREFERRED EMBODIMENTS

The accompanying figures to be used in the description of embodiments of the present disclosure will be described in brief to more clearly illustrate the technical solutions of the embodiments. The accompanying figures described below are only part of the embodiments of the present disclosure, from which figures those skilled in the art can derive further figures without making any inventive efforts.

A method of cutting a flexible substrate includes providing a flexible substrate pre-configured with a cutting area, providing an obstruction covering a non-cutting area of the flexible substrate to expose the cutting area of the flexible substrate, and performing a dry etching to the flexible substrate to decompose the cutting area of the flexible substrate.

Figure 1:
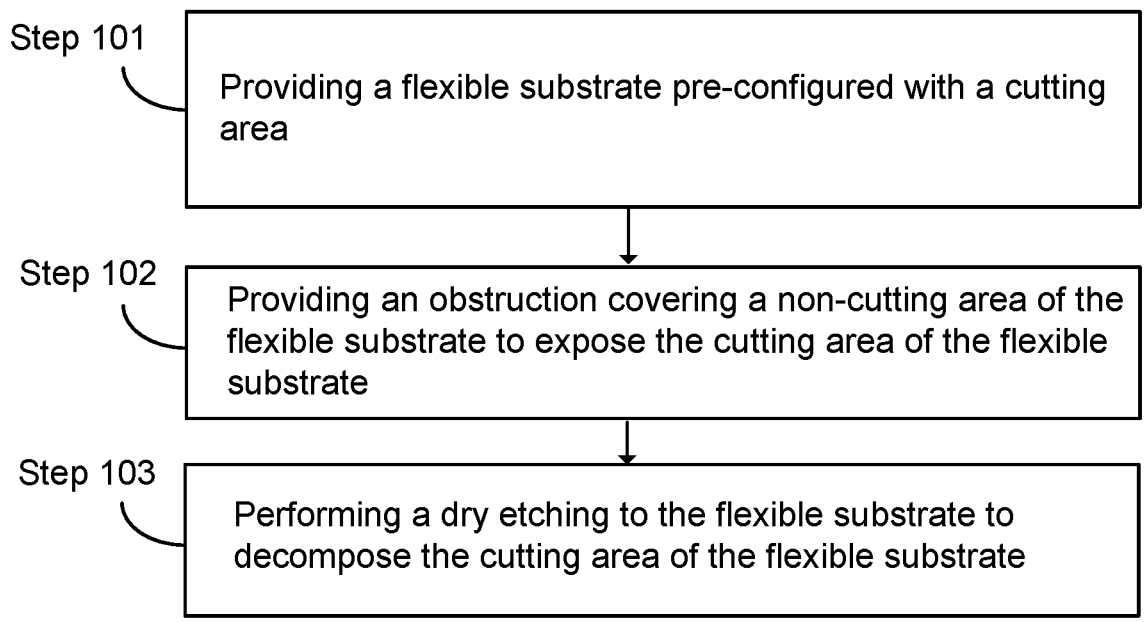
FIG. 1 is a schematic flowchart of a method of cutting a flexible substrate according to an embodiment of the present disclosure.

Referring to FIG. 1, a schematic flowchart of a method of cutting a flexible substrate according to an embodiment of the present disclosure is provided. Detail process of the method of cutting the flexible substrate may be as follows.

In a step 101, the method includes providing a flexible substrate pre-configured with a cutting area.

Figure 2:
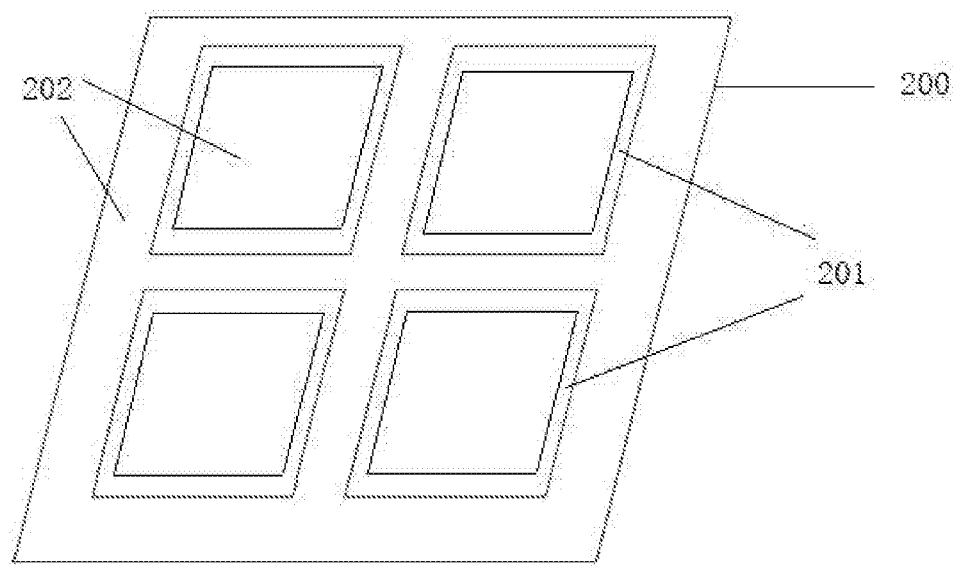
FIG. 2 is a schematic structural diagram of a flexible substrate of a method of cutting the flexible substrate according to an embodiment of the present disclosure.

In details, referring to FIG. 2, a flexible substrate 200 includes a cutting area 201 and a non-cutting area 202. The non-cutting area 202 is an area other than the cutting area 201 on the flexible substrate 200. The non-cutting area 202 includes a plurality of regularly arranged display areas, and the cutting area 201 may be disposed between the display areas.

In a step 102, the method includes providing an obstruction covering a non-cutting area of the flexible substrate to expose the cutting area of the flexible substrate.

In details, after the flexible substrate is peeled off from the glass substrate, the non-cutting area of the flexible substrate is blocked, and only the cutting area of the flexible substrate is exposed to facilitate subsequent cutting of the cutting area of the flexible substrate.

In an embodiment of the present disclosure, the obstruction is a photoresist.

Providing the obstruction covering the non-cutting area of the flexible substrate to expose the cutting area of the flexible substrate includes coating a layer of the photoresist on a surface of the flexible substrate, attaching a photomask to the photoresist, and performing an exposure process to the photoresist on the flexible substrate by the photomask to retain the photoresist on the non-cutting area and dissolve the photoresist on the cutting area.

It is understood that a layer of the photoresist is coated on all areas of the flexible substrate (including the cutting area and the non-cutting area), and then a photomask is designed to make a part area of the photomask light transmissive, and some areas are opaque. The photomask is attached to the coated photoresist to make the light transmissive area and the opaque area of the photomask correspond to the cutting area and the non-cutting area of the flexible substrate, thereby ensuring the flexible substrate after the exposure of the flexible substrate. The photoresist on the cutting area is retained and the photoresist on the non-cutting area is dissolved. After the exposure process, the photomask on the photoresist is removed, such that the non-cutting area of the flexible substrate is blocked, and only the non-cutting area of the flexible substrate is exposed.

In details, the photoresist is divided into a positive photoresist and a negative photoresist. If a positive photoresist is coated on the flexible substrate, a photomask is designed to match the light transmissive area of the photomask with a size, shape, and position of the cutting area of the flexible substrate to make the opaque area of the photomask match the size, shape, and position of the non-cutting area of the flexible substrate. After the photomask is attached to the photoresist coated on the flexible substrate, the light transmissive area of the photomask is correspondingly attached to the cutting area of the flexible substrate, and the opaque area of the photomask is correspondingly attached to the non-cutting area of the flexible substrate. When exposing the photoresist on the flexible substrate, the cutting area of the flexible substrate is light transmissive, such that the photoresist on the cutting area is dissolved, and the non-cutting area of the flexible substrate is opaque, such that the photoresist on the non-cutting area is retained.

If a negative photoresist is coated on the flexible substrate, a photomask is designed to match the light transmissive area of the photomask with a size, shape, and position of the non-cutting area of the flexible substrate to make the opaque area of the photomask match the size, shape, and position of the cutting area of the flexible substrate. After the photomask is attached to the photoresist coated on the flexible substrate, the light transmissive area of the photomask is correspondingly attached to the non-cutting area of the flexible substrate, and the opaque area of the photomask is correspondingly attached to the cutting area of the flexible substrate. When exposing the photoresist on the flexible substrate, the cutting area of the flexible substrate is opaque, such that the photoresist on the cutting area is dissolved, and the non-cutting area of the flexible substrate is light transmissive, such that the photoresist on the non-cutting area is retained.

In an embodiment of the present disclosure, the obstruction is a stretched net, and providing the obstruction covering the non-cutting area of the flexible substrate using a stretched net device to expose the cutting area of the flexible substrate includes attaching the stretched net to the non-cutting area of the flexible substrate to expose the cutting area of the flexible substrate.

It is understood that one piece of stretched net is designed such that the stretched net includes a hollowed-out area, and the hollowed-out area matches a size, shape, and position of the cutting area of the flexible panel. The stretched net is designed to be attached to the surface of the flexible substrate using the stretched net device, such that the hollowed-out area of the stretched net and the cutting area of the flexible substrate are completely matched, and the non-cutting area of the flexible substrate is blocked by the stretched net, and only the cutting area of the flexible substrate is exposed.

In details, the stretched net includes a metal stretched net or a quartz stretched net.

In a step 103, the method includes performing a dry etching to the flexible substrate to decompose the cutting area of the flexible substrate.

In details, the flexible substrate is placed in a chamber of a dry etching apparatus, and an etching gas is introduced into the chamber through an air inlet to etch the flexible substrate in the chamber.

When the flexible substrate is dry etched, the flexible substrate covered by the obstruction is not in contact with the etching gas so as not to be decomposed, and the exposed flexible substrate is decomposed by the etching gas by contact with the etching gas, that is, the non-cutting region of the flexible substrate is retained, and the flexible substrate of the cutting area is decomposed to reach cutting of the flexible substrate.

It is understood that the flexible substrate is made of polyimide (PI), such that the flexible substrate can be etched using sulfur hexafluoride (SF6). Sulfur hexafluoride can decompose polyimide, but does not react to the photoresist, the metal stretched net, or the quartz stretched net.

Figure 3:
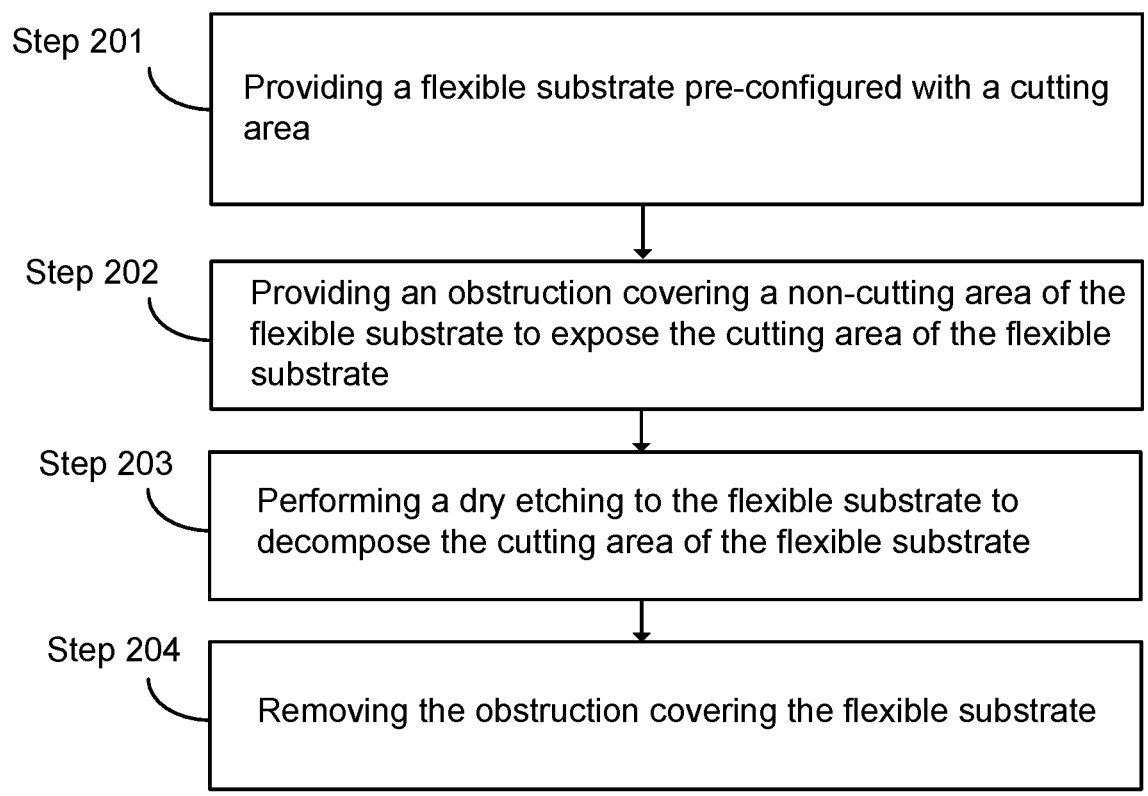
FIG. 3 is a schematic flowchart of a method of cutting a flexible substrate according to another embodiment of the present disclosure.

Referring to FIG. 3, a schematic flowchart of a method of cutting a flexible substrate according to another embodiment of the present disclosure is provided. Detail process of the method of cutting the flexible substrate may be as follows.

In a step 201, the method includes providing a flexible substrate pre-configured with a cutting area.

In a step 202, the method includes providing an obstruction covering a non-cutting area of a flexible substrate to expose the cutting area of the flexible substrate.

In a step 203, the method includes performing a dry etching to the flexible substrate to decompose the cutting area of the flexible substrate.

In a step 204, the method includes removing the obstruction covering the flexible substrate.

In details, if the obstruction is a photoresist, the photoresist on the non-cutting area of the flexible substrate is dissolved by a photoresist stripping solution to obtain a cut flexible substrate. If the obstruction is a stretched net, one end of the stretched net on the flexible substrate is clamped by a stretched net device to separate the stretched net from the flexible substrate to obtain a cut flexible substrate.

In summary, in the method of cutting the flexible substrate of the embodiment of the present disclosure, when the flexible substrate is cut, the non-cutting area of the flexible substrate is covered with the obstruction, the cutting area of the flexible substrate is exposed, and then the flexible substrate is dry etched, only the flexible substrate of the cutting area is decomposed to perform cutting of the flexible substrate, and no heat is generated during a cutting process to protect internal components of the flexible substrate.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A method of cutting a flexible substrate, comprising:
providing a flexible substrate pre-configured with a cutting area;
providing an obstruction covering a non-cutting area of the flexible substrate to expose the cutting area of the flexible substrate; and
performing a dry etching to the flexible substrate to decompose the cutting area of the flexible substrate;
wherein the obstruction is a stretched net, and providing the obstruction covering the non-cutting area of the flexible substrate using a stretched net device to expose the cutting area of the flexible substrate comprises attaching the stretched net to the non-cutting area of the flexible substrate to expose the cutting area of the flexible substrate.

2. The method of cutting the flexible substrate according to claim 1, wherein the obstruction is a photoresist, and providing the obstruction covering the non-cutting area of the flexible substrate to expose the cutting area of the flexible substrate comprises:
coating a layer of the photoresist on a surface of the flexible substrate;
attaching a photomask to the photoresist; and
performing an exposure process to the photoresist on the flexible substrate by the photomask to retain the photoresist on the non-cutting area and dissolve the photoresist on the cutting area.

3. The method of cutting the flexible substrate according to claim 2, wherein the photoresist is a positive photoresist and the photomask comprises an opaque area corresponding to the non-cutting area of the flexible substrate and a light transmissive area corresponding to the cutting area of the flexible substrate, in the exposure process, the photoresist on the non-cutting area of the flexible substrate not exposed to light is retained, and the photoresist on the cutting area of the flexible substrate exposed to the light is dissolved.

4. The method of cutting the flexible substrate according to claim 2, wherein the photoresist is a negative photoresist and the photomask comprises an opaque area corresponding to the cutting area of the flexible substrate and a light transmissive area corresponding to the non-cutting area of the flexible substrate, in the exposure process, the photoresist on the non-cutting area of the flexible substrate exposed to light is retained, and the photoresist on the cutting area of the flexible substrate not exposed to the light is dissolved.

5. The method of cutting the flexible substrate according to claim 2, wherein after performing the exposure process to the flexible substrate, the method further comprises removing the photomask on the photoresist.

6. The method of cutting the flexible substrate to claim 1, wherein the stretched net comprises a metal stretched net or a quartz stretched net.

7. The method of cutting the flexible substrate according to claim 1, wherein the flexible substrate is made of polyimide, and performing the dry etching to the flexible substrate to decompose the cutting area of the flexible substrate comprises dry etching to the flexible substrate using sulfur hexafluoride to decompose the cutting area of the flexible substrate.

8. The method of cutting the flexible substrate according to claim 2, wherein after performing the dry etching to the flexible substrate, the method further comprises dissolving the photoresist on the non-cutting area of the flexible substrate using a photoresist stripping solution.

9. The method of cutting the flexible substrate according to claim 1, wherein after performing the dry etching to the flexible substrate, the method further comprises separating the stretched net from the flexible substrate using the stretched net device.

10. A method of cutting a flexible substrate, comprising:
providing a flexible substrate pre-configured with a cutting area;
providing an obstruction covering a non-cutting area of the flexible substrate to expose the cutting area of the flexible substrate;
performing a dry etching to the flexible substrate to decompose the cutting area of the flexible substrate; and
removing the obstruction covering the flexible substrate;
wherein the obstruction is a stretched net, and providing the obstruction covering the non-cutting area of the flexible substrate using a stretched net device to expose the cutting area of the flexible substrate comprises attaching the stretched net to the non-cutting area of the flexible substrate to expose the cutting area of the flexible substrate.

11. The method of cutting the flexible substrate according to claim 10, wherein the obstruction is a photoresist, and providing the obstruction covering the non-cutting area of the flexible substrate to expose the cutting area of the flexible substrate comprises:
coating a layer of the photoresist on a surface of the flexible substrate;
attaching a photomask to the photoresist; and
performing an exposure process to the photoresist on the flexible substrate by the photomask to retain the photoresist on the non-cutting area and dissolve the photoresist on the cutting area.

12. The method of cutting the flexible substrate according to claim 11, wherein the photoresist is a positive photoresist and the photomask comprises an opaque area corresponding to the non-cutting area of the flexible substrate and a light transmissive area corresponding to the cutting area of the flexible substrate, in the exposure process, the photoresist on the non-cutting area of the flexible substrate not exposed to light is retained, and the photoresist on the cutting area of the flexible substrate exposed to the light is dissolved.

13. The method of cutting the flexible substrate according to claim 11, wherein the photoresist is a negative photoresist and the photomask comprises an opaque area corresponding to the cutting area of the flexible substrate and a light transmissive area corresponding to the non-cutting area of the flexible substrate, in the exposure process, the photoresist on the non-cutting area of the flexible substrate exposed to light is retained, and the photoresist on the cutting area of the flexible substrate not exposed to the light is dissolved.

14. The method of cutting the flexible substrate according to claim 11, wherein after performing the exposure process to the flexible substrate, the method further comprises removing the photomask on the photoresist.

15. The method of cutting the flexible substrate to claim 10, wherein the stretched net comprises a metal stretched net or a quartz stretched net.

16. The method of cutting the flexible substrate according to claim 10, wherein the flexible substrate is made of polyimide, and performing the dry etching to the flexible substrate to decompose the cutting area of the flexible substrate comprises dry etching to the flexible substrate using sulfur hexafluoride to decompose the cutting area of the flexible substrate.

17. The method of cutting the flexible substrate according to claim 11, wherein removing the obstruction covering the flexible substrate comprises dissolving the photoresist on the non-cutting area of the flexible substrate using a photoresist stripping solution.

18. The method of cutting the flexible substrate according to claim 10, wherein removing the obstruction covering the flexible substrate comprises separating the stretched net from the flexible substrate using the stretched net device.

* * * * *